(12) United States Patent
Graham

(10) Patent No.: US 10,443,676 B2
(45) Date of Patent: Oct. 15, 2019

(54) ISOLATED SEEKER OPTICS

(71) Applicant: Rosemount Aerospace Inc., Burnsville, MN (US)

(72) Inventor: Jason Graham, Prior Lake, MN (US)

(73) Assignee: Rosemount Aerospace Inc., Burnsville, MN (US)

(*) Notice: Subject to any disclaimer, the term of this patent is extended or adjusted under 35 U.S.C. 154(b) by 8 days.

(21) Appl. No.: 15/709,879

(22) Filed: Sep. 20, 2017

(65) Prior Publication Data

US 2019/0085931 A1 Mar. 21, 2019

(51) Int. Cl.
| | |
|---|---|
| *H04N 5/225* | (2006.01) |
| *F16F 15/02* | (2006.01) |
| *G02B 27/64* | (2006.01) |
| *G02B 7/02* | (2006.01) |
| *B60R 11/04* | (2006.01) |
| *G03B 17/12* | (2006.01) |
| *G03F 7/20* | (2006.01) |

(52) U.S. Cl.
CPC .......... *F16F 15/022* (2013.01); *B60R 11/04* (2013.01); *G02B 7/021* (2013.01); *G02B 7/026* (2013.01); *G02B 27/644* (2013.01); *G03B 17/12* (2013.01); *G03F 7/709* (2013.01); *H04N 5/2254* (2013.01); *H04N 5/2257* (2013.01)

(58) Field of Classification Search
CPC .................................................. H04N 5/2254
USPC ......................................................... 348/335
See application file for complete search history.

(56) References Cited

U.S. PATENT DOCUMENTS

| | | | |
|---|---|---|---|
| 5,485,053 A | 1/1996 | Baz | |
| 6,700,715 B2 | 3/2004 | Sorg et al. | |
| 7,002,139 B2 | 2/2006 | Stallard et al. | |
| 7,145,124 B2 | 12/2006 | Garrood et al. | |
| 8,049,148 B2 | 11/2011 | Facciano et al. | |
| 8,532,475 B2* | 9/2013 | Kim ...................... | G03B 17/02 |
| | | | 359/513 |
| 8,567,969 B2 | 10/2013 | Thomas et al. | |
| 2013/0142502 A1* | 6/2013 | Kang ...................... | G03B 5/00 |
| | | | 396/55 |

(Continued)

FOREIGN PATENT DOCUMENTS

| | | |
|---|---|---|
| CN | 204154187 U | 2/2015 |
| EP | 0376879 A2 | 7/1990 |
| JP | H08152661 A | 6/1996 |

(Continued)

OTHER PUBLICATIONS

Extended European Search Report for European Patent Application No. 18195430.6, dated Feb. 12, 2019, 9 pages.

*Primary Examiner* — Anthony J Daniels
(74) *Attorney, Agent, or Firm* — Kinney & Lange, P.A.

(57) ABSTRACT

An optical lens stack includes an inner ring of a mounting structure containing axially spaced circumferential lens mounting surfaces on an inside diameter of the inner ring. The inner ring further includes a groove over a fixed axial length on the outer diameter. An outer ring formed to fit over the inner ring contains a groove on the inner diameter of the outer ring that corresponds to the groove on the inner ring and forms a circumferential cavity when the outer ring is mounted on the inner ring. The resulting cavity is filled with an energy absorbing material and serves as a vibration isolator for the lens stack.

20 Claims, 5 Drawing Sheets

(56) References Cited

U.S. PATENT DOCUMENTS

2018/0180722 A1* 6/2018 Pei ..................... G01S 7/4815
2019/0086684 A1* 3/2019 Graham ............. G02B 13/0045

FOREIGN PATENT DOCUMENTS

| WO | WO2009093740 A1 | 7/2009 |
| WO | WO2014026202 A2 | 2/2014 |

* cited by examiner

ISOLATED SEEKER OPTICS

BACKGROUND

The disclosed subject matter relates generally to imaging apparatus and methods and more specifically to optical elements usable in air vehicles and munitions.

Quality imaging optical components are made from crystalline and glass materials, which are very brittle and sensitive to stress concentrations and tensile stresses. Mounting of elements made from these materials for survival under high launch and impact acceleration and forces such as unmanned air vehicles, rockets, and gun launches can be very challenging due to catastrophic failure modes of these brittle materials. Any existing or new stress concentration can cause a fracture initiation point and the optical element can be prone to shattering. This can happen, for example, in gun-launched vehicles if internal vibration, shock and resonance stress mitigation mechanisms in a vehicle structure are unable to meet or exceed mission requirements.

SUMMARY

An optical lens stack includes an inner ring of a mounting structure containing axially spaced circumferential lens mounting surfaces on an inside diameter of the inner ring. The inner ring further includes a groove over a fixed axial length on the outer diameter. An outer ring formed to fit over the inner ring contains a groove on the inner diameter of the outer ring that corresponds to the groove on the inner ring and forms a circumferential cavity when the outer ring is mounted on the inner ring. The resulting cavity is filled with an energy absorbing material and serves as a vibration isolator for the lens stack.

In an embodiment, a method of forming an optical stack includes forming an inner ring with an outer diameter and axially-spaced circumferential lens mounting surfaces on an inner diameter. The method further includes forming a groove of a fixed axial length on the outer diameter of the inner ring. An outer ring with a groove on an inner diameter with the same fixed axial length is formed that fits over the inner ring and forms a circumferential cavity. Filling the cavity with an energy absorbing material creates a vibration isolator for the lens stack.

DETAILED DESCRIPTION

The present disclosure relates to an optical assembly and method of assembly. The assembly includes a mounting structure that houses a plurality of axially-spaced optical lenses. The mounting structure and the lenses have matching surfaces that may be used to secure the lenses in the mounting structure. The optical assembly further includes a mechanical isolation feature that dampens and otherwise mitigates shock and vibrations in particular resonances that lead to physical damage in the lenses. The isolator also limits setback, setforward, and rotational motions that may physically and operationally degrade the performance of the optical assembly. A feature of the isolator is a cavity that surrounds the optical assembly and is filled with an energy absorbing material tuned to attenuate particular frequencies that could cause damage to the optical assembly.

Figure 1:
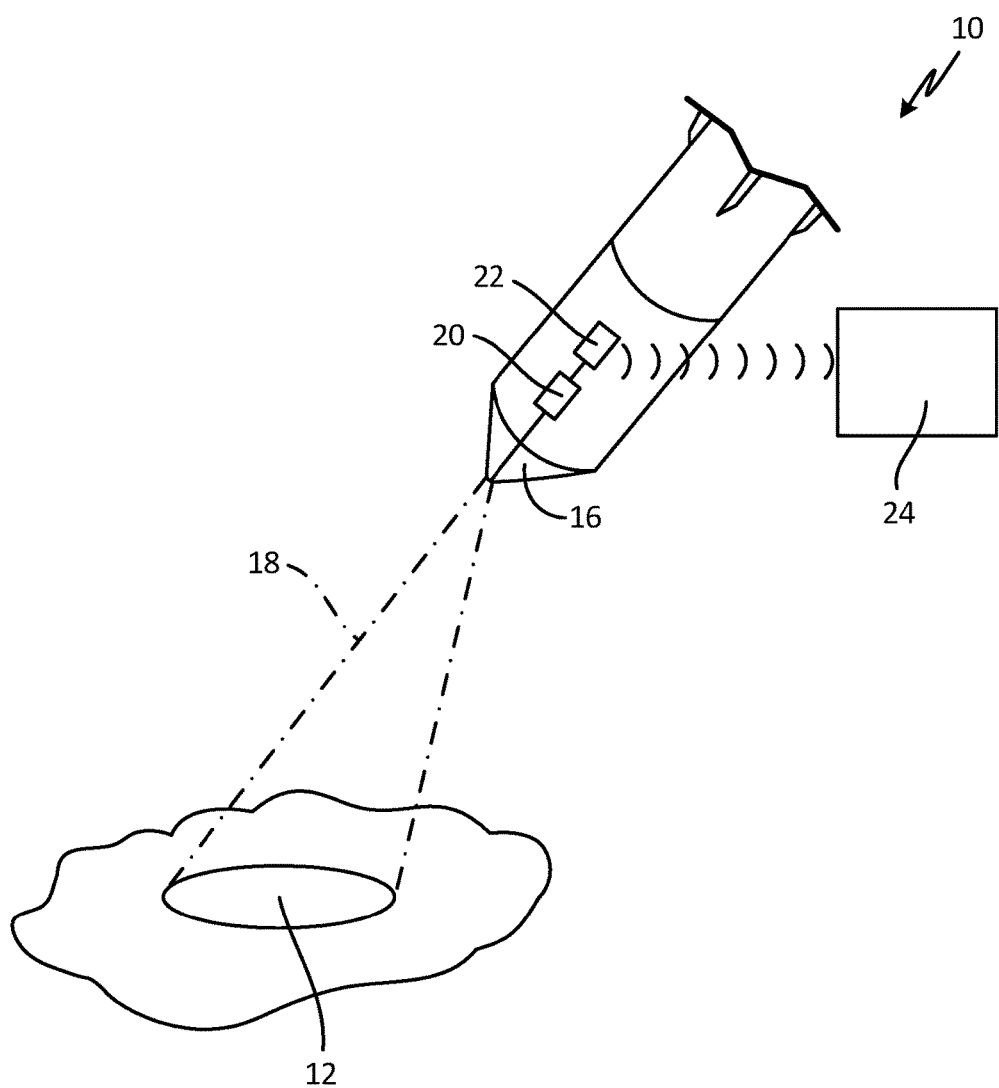
FIG. 1 shows an aerial vehicle in flight with a forward mounted imaging system.

FIG. 1 schematically illustrates air vehicle 10 in transit to a ground location 12. Air vehicle 10 may be an unmanned air vehicle (UAV), rocket, missile or other munition, though the present disclosure is not so limited.

Air vehicle 10 is outfitted with an imaging system at or near nose 16. The imaging system provides still images and/or video of some or all of view range 18. These images or videos are taken by a full range imaging sensor 20 which is in communication with onboard controller 22. Onboard controller 22 can, for example, use and process data from imaging sensor 20 for guidance purposes and/or can include a wireless radio configured to communicate with external location 24, for example to transmit images or video to external location 24.

To provide the desired or optimal resolution for imaging sensor 20, the imaging system can include an embodiment of an optical assembly according to the present disclosure.

Figure 2:
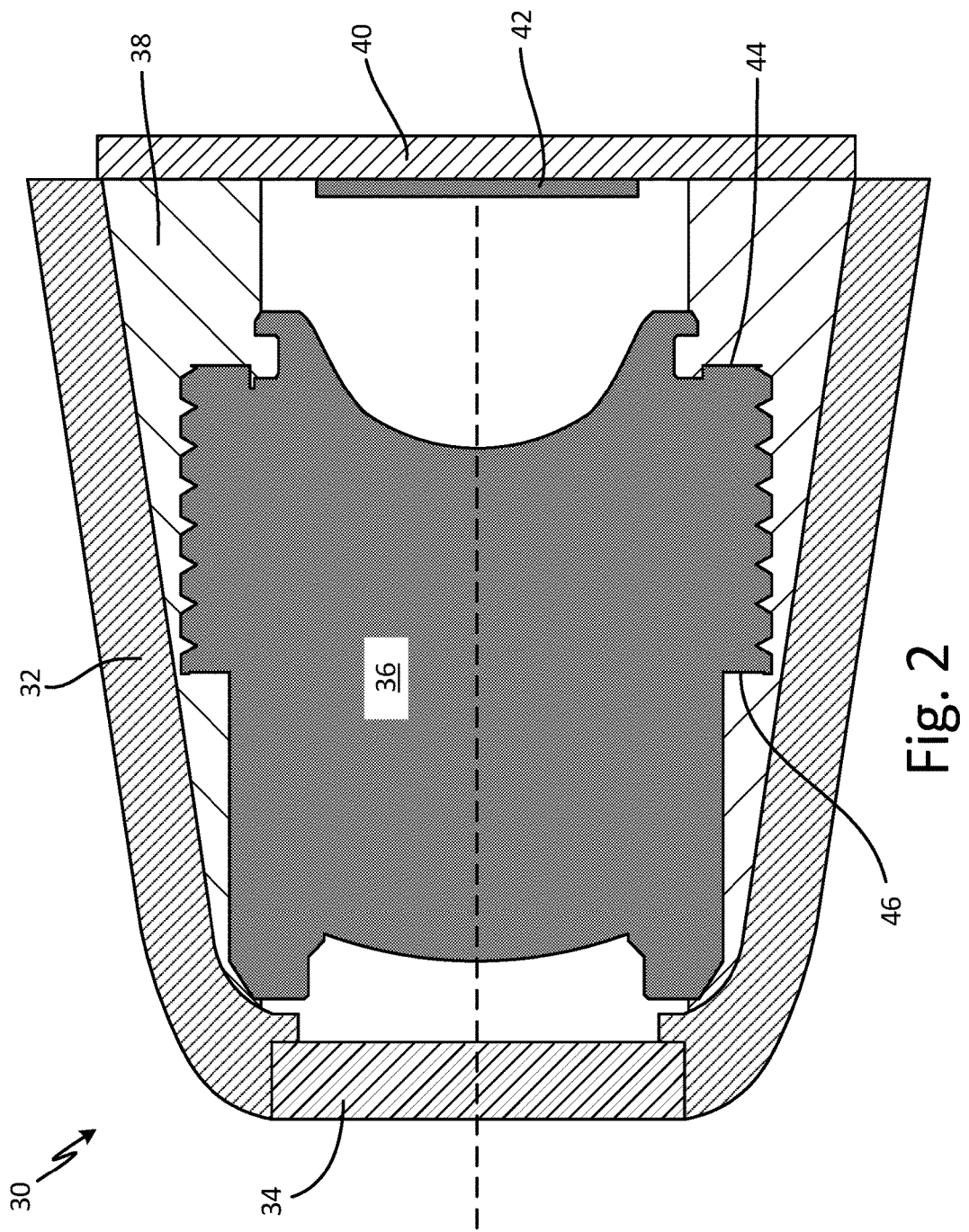
FIG. 2 is a schematic cross-section of a forward mounted imaging optical system.

An example of such an embodiment is shown in FIG. 2. FIG. 2 is a schematic cross-sectional view of optical assembly 30. Optical assembly 30 is a substantially cylindrical structure that supports an optical lens stack. Optical assembly 30 includes housing 32, window 34, optical lens stack 36, internal mounting structure 38, electronic package 40, and focal plane array 42. Stops 44 and 46 minimize setback and setforward motion respectively during a launch event. In an embodiment, optical wavelengths of interest for optical assembly 30 range from infrared to visible.

Figure 3:
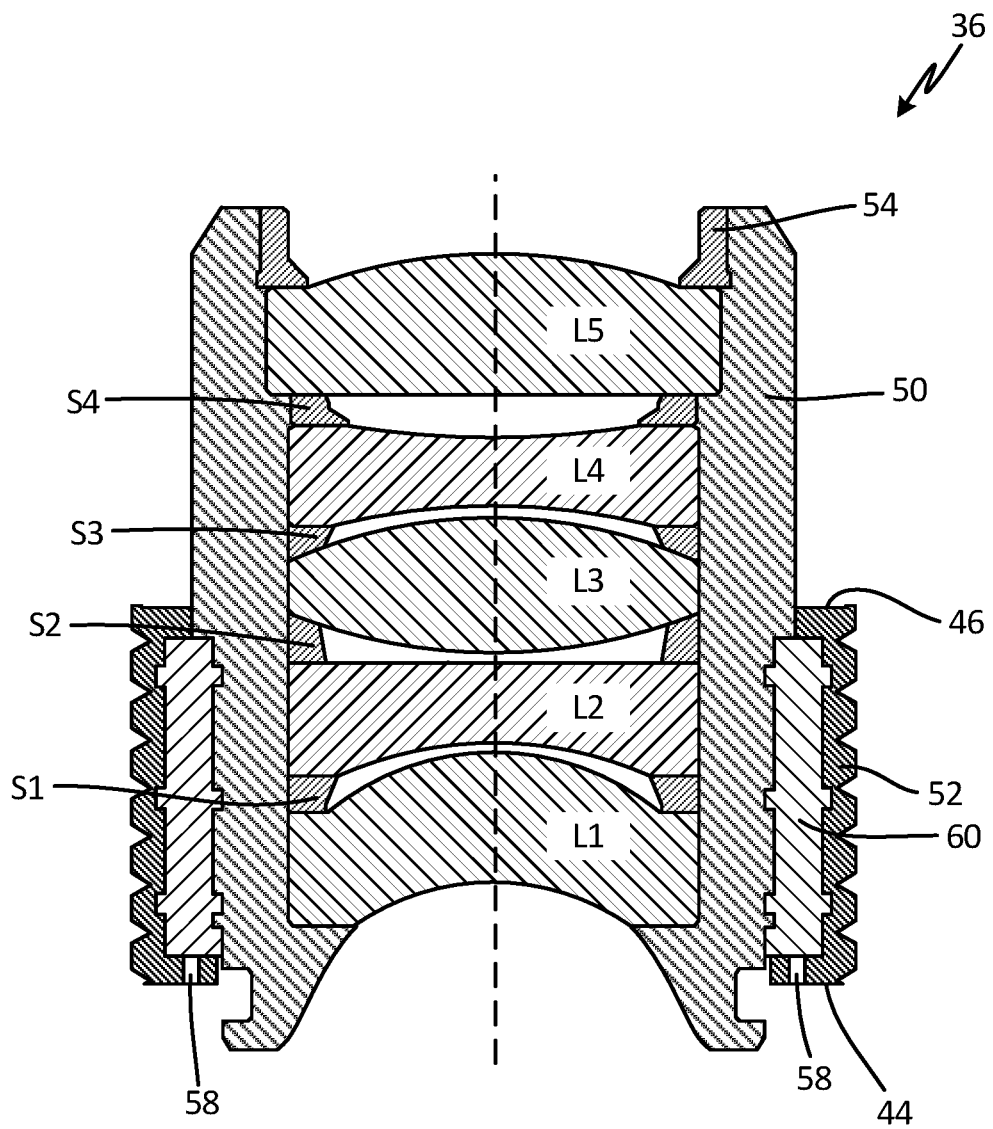
FIG. 3 is a schematic cross-section of an optical lens stack with a vibration isolator.

Cross-sectional details of lens stack 36 are shown in FIG. 3. Cylindrical lens stack 36 includes metal inner ring 50, metal outer ring 52, lenses L1-L5 and spacers S1-S4. Retaining ring 54 secures the lens stack after assembly.

The configuration of lens stack 36 shown in FIG. 3 is only one of a number of possible embodiments that may be utilized for optical sensing applications in the art of seeker optics.

Cavity 60 between inner ring 50 and outer ring 52 may be filled with an energy absorbing material such as rubber, flexible Kevlar composites, Kevlar doped elastomers or other rubber-like material through holes 58. Outer ring 52 and filled cavity 60 provide an opto-mechanical isolator structure that dampens and mitigates shock and vibration. The isolator may be designed such that it includes stops 44 and 46 to limit setback and setforward travel. The natural frequency of the isolator may be designed to attenuate particular frequencies that could cause damage in the optical stack. In addition, the filler of cavity 60 is a thermal barrier that decreases the amount of heat transferred by thermal conduction through the housing into the lens stack in an operation such as a gun launch.

Figure 4:
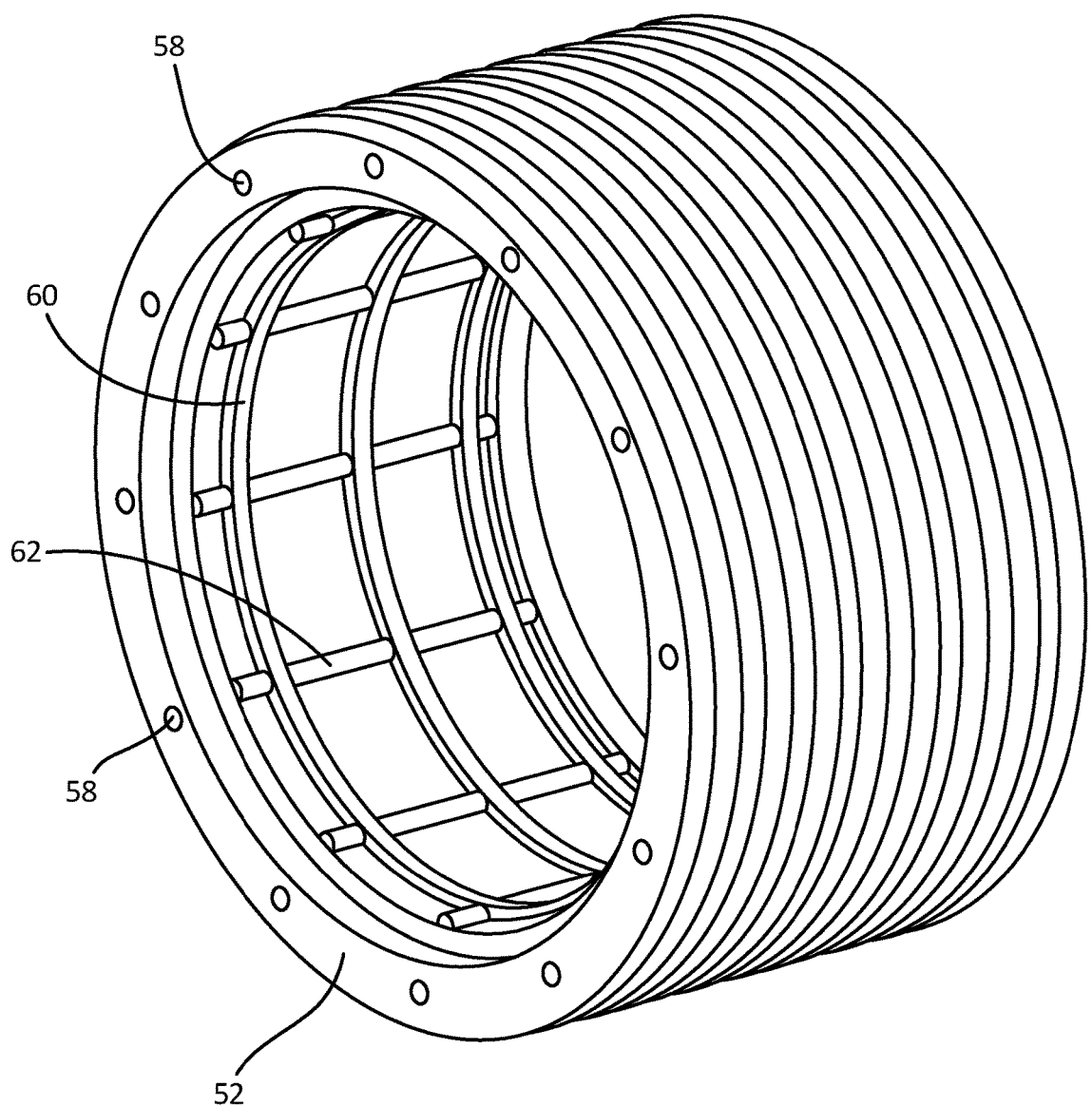
FIG. 4 is a perspective view of an isolator insert.

The outside diameter of inner ring 50 and the inside diameter of outer ring 52 may have circumferential and axial grooves that result in barriers to setback, setforward, and rotation during operation. A perspective view of outer ring 52 showing the cast rubber liner is shown in FIG. 4. Circumferential barriers 60 to setback and setforward motion are formed by circumferential grooves in the outer diameter of ring 50 and the inner diameter of ring 52. Axial barriers 62 to rotational motion result from axial grooves in the outer diameter of ring 50 and the inner diameter of ring 52.

Figure 5:
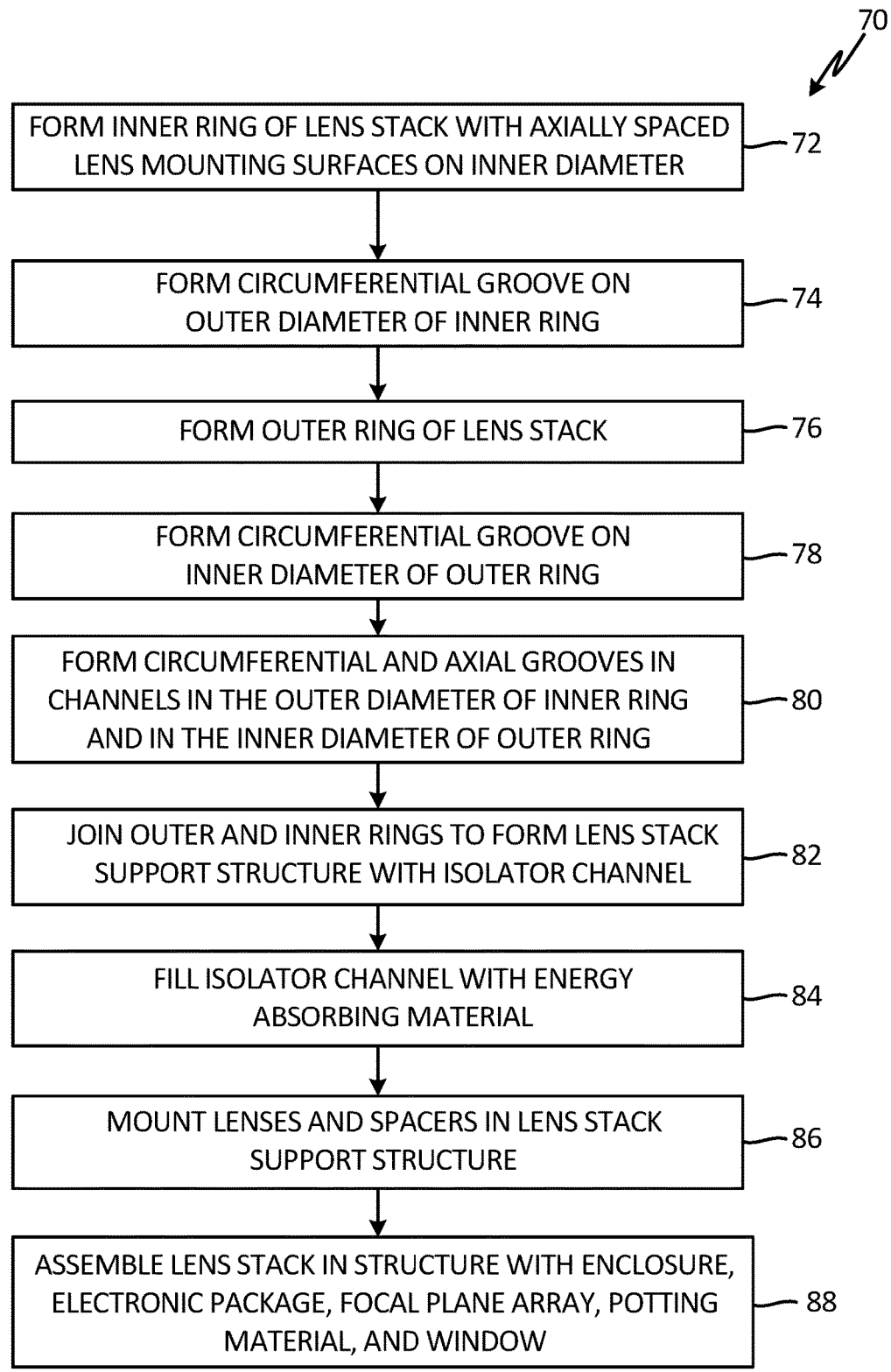
FIG. 5 is a method of forming an optical lens stack.

FIG. 5 is a flow diagram of a method of forming the vibration isolated optical lens stack 36. Method 70 includes forming inner ring 50 of the mounting structure capable of containing a series of axially mounted circular lenses L1-L5 (step 72). The lenses may be positioned in inner ring 50 on circumferential mounting surfaces that closely match the outer surfaces of the lenses in the stack. A circumferential groove is formed along a fixed axial length on the outer diameter of inner ring 50 (step 74). Before the lenses are inserted in the lens stack, the vibration isolator structure is formed. To accomplish this, outer ring 52 is formed that closely fits over the outside diameter of inner ring 20 (step 76). The outer ring may be threaded for future insertion in a seeker assembly. A circumferential groove is formed in the inner diameter of outer ring 52 along the same fixed axial length of the outer ring to form a circumferential cavity 60 (step 78). Circumferential and axial grooves are machined in the inner diameter of outer ring 52 and the outer diameter of inner ring 50 in the channel (step 80).

In the next step, outer ring 52 is installed on inner ring 50 to form isolator cavity 60 (step 82). The resulting isolator cavity may be filed with a rubber or rubber-like energy absorbing material to form the isolator for damping/mitigating vibration (step 84). The opto-mechanical isolator structure includes outer ring 52, cavity 60, and the energy absorbing material. The grooves filled with the cast energy absorbing material act to prevent shifting during setback, setfoward and rotation during launch and flight.

The isolator structure is placed on the lens stack such that the resulting vibration and shock isolation structure is centered on the center of gravity of the system to prevent rocking during launch. The lenses are then installed in the inner ring with spacers between each lens such that the outer surfaces of the lenses match their respective circumferential mounting surfaces in inner ring 50 (step 86).

Final steps of the assembly include securing the optical lens stack in position on a focal plane array and associated electronic assembly behind a protective window (step 90).

DISCUSSION OF POSSIBLE EMBODIMENTS

An optical lens stack may include an inner ring of a mounting structure including a plurality of axially spaced circumferential lens mounting surfaces on an inside diameter of the inner ring, wherein an outside diameter of the inner ring is grooved over a fixed axial distance to form a circumferential channel in the outside diameter of the inner ring. The lens stack further includes an outer ring formed to fit over the inner ring, wherein an inside diameter of the outer ring is grooved along the same fixed axial distance as the inner ring thereby forming a circumferential cavity between the inside diameter of the outer ring and the outside diameter of the inner ring when the outer ring is mounted on the inner ring. The lens stack further includes an energy absorbing conformal filler material that fills the cavity to form a mechanical vibration isolator in the mounting structure of the optical lens stack and a plurality of optical lenses formed to fit the lens mounting surfaces on the inside diameter of the inner ring of the mounting structure.

The optical lens stack of the preceding paragraph can optionally include, additionally and/or alternatively, any one or more of the following features, configurations and/or additional components:

The inner and outer rings may be metal.

The cavity between the inside diameter of the outer ring and the outside diameter of the inner ring may have axial and circumferential grooves that act to prevent the filler material cast in the cavity from rotating or translating during operation.

The conformal filler material that fills the cavity may be rubber, flexible Kevlar composites, or Kevlar doped elastomers.

The optical lens may be separated from each other by spacers.

The top lens in the stack may be secured by a circular retainer attached to the inner ring.

The energy absorbing conformal filler material may be a thermal insulator.

The optical lens stack may operate in an optical wavelength range from infrared to visible.

The cavity and filler material that form the vibration isolator may be centered on a center of gravity of the optical lens stack to minimize rocking during operation.

A method of forming an optical lens stack includes forming an inner ring with an outer diameter and axially spaced circumferential lens mounting surfaces on an inner diameter and forming a groove on a portion of the outer diameter of the inner ring along a fixed axial length to form a circumferential channel on the outer diameter of the inner ring. The method further includes forming an outer ring with an inner diameter sized to fit closely over the inner ring and forming a groove on the inner diameter of the outer ring along the same fixed axial length to form a circumferential channel. Attaching the outer ring to the inner ring such that channels in both coincide to form a cavity and filling the cavity with an energy absorbing material forms a mechanical isolator substructure. The method further includes inserting a plurality of circular lenses in the inner rings positioned on the axially spaced circumferential lens mounting surfaces and attaching a retaining ring over the last lens to secure the optical lens stack.

The method of the preceding paragraph can optionally include, additionally and/or alternatively, any one or more of the following features, configurations and/or additional components:

The inner ring and outer ring may be metal.

The cavity between the inside diameter of the outer ring and outside diameter of the inner ring may contain axial and circumferential grooves that act to restrain the filler material in the cavity from rotating or translating.

The outer ring may contain holes that allow filler material to be injected into the cavity.

The isolator cavity may be placed in the lens stack such that the vibration isolator is centered on a center of gravity of the structure.

The energy absorbing filler material may be a thermal insulator.

Each lens in the stack may be separated by spacers.

A vibration isolator for a cylindrical optical lens stack may include an inner ring of a mounting structure for the optical lens stack wherein an outside diameter of the inner ring is grooved over a fixed axial distance to form a circumferential channel on the outside diameter of the inner ring. The isolator structure further includes an outer ring formed to fit over the inner ring wherein an inside diameter of the outer ring is grooved over the same fixed axial distance as the inner ring thereby forming a circumferential cavity between the inside diameter of the outer ring and outside diameter of the inner ring. An energy absorbing conformal filler material may fill the cavity to form a mechanical vibration isolator for the lens stack.

The vibration isolator of the preceding paragraph can optionally include, additionally and/or alternatively, any one or more of the following features, configurations and/or additional components:

The inner and outer rings may be metal.

The cavity between the inside diameter of the outer ring and the outside diameter of the inner ring may have axial and circumferential grooves that act to prevent the filler material cast in the cavity from rotating or translating during operation.

The energy absorbing conformal filler material may be a thermal insulator.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An optical lens stack comprising:
   an inner ring of a mounting structure including a plurality of axially-spaced circumferential lens mounting surfaces on an inside diameter of the inner ring, wherein an outside diameter of the inner ring is grooved over a fixed axial distance to form a circumferential channel in the outside diameter of the inner ring;
   an outer ring formed to fit over the inner ring, wherein an inside diameter of the outer ring is grooved along the fixed axial distance as the inner ring thereby forming a circumferential cavity between the inside diameter of the outer ring and the outside diameter of the inner ring when the outer ring is mounted on the inner ring;
   an energy absorbing conformal filler material that fills the cavity to form a mechanical vibration isolator in the mounting structure of the optical lens stack; and
   a plurality of optical lenses formed to fit the lens mounting surfaces on the inside diameter of the inner ring of the mounting structure.

2. The optical lens stack of claim 1 wherein the inner ring and the outer ring are metal.

3. The optical lens stack of claim 1 wherein the cavity has axial and circumferential grooves that act to prevent the filler material from rotating or translating during operation.

4. The optical lens stack of claim 1 wherein the filler material is rubber, flexible Kevlar composites, or Kevlar doped elastomers.

5. The optical lens stack of claim 1 wherein the plurality of optical lenses are separated from each other by spacers.

6. The optical lens stack of claim 1 wherein a top lens in the optical lens stack is secured by a circular retainer attached to the inner ring.

7. The optical lens stack of claim 1 wherein the filler material is a thermal insulator.

8. The optical lens stack of claim 1 wherein the optical lens stack operates in an optical wavelength range from infrared to visible.

9. The optical lens stack of claim 1 wherein the cavity and the filler material are centered on a center of gravity of the optical lens stack to minimize rocking during operation.

10. A method of forming an optical lens stack comprising:
    forming an inner ring with an outer diameter and axially-spaced circumferential lens mounting surfaces on an inner diameter;
    forming a groove on a portion of the outer diameter of the inner ring along a fixed axial length to form a first circumferential channel on the outer diameter of the inner ring;
    forming an outer ring with an inner diameter sized to fit over the inner ring;
    forming a groove on the inner diameter of the outer ring along the fixed axial length to form a second circumferential channel;
    attaching the outer ring to the inner ring such that the first channel and second channel coincide to form a cavity;
    filling the cavity with an energy absorbing material to form a mechanical isolator substructure;
    inserting a plurality of circular lenses in the inner ring positioned on the axially-spaced circumferential lens mounting surfaces; and
    attaching a retaining ring over a last lens of the plurality of circular lenses to secure the optical lens stack.

11. The method of claim 10 wherein the inner ring and the outer ring are metal.

12. The method of claim 10 wherein the cavity has axial and circumferential grooves that act to restrain the filler material from rotating or translating during operation.

13. The method of claim 10 wherein the outer ring contains holes that allow filler material to be injected into the cavity.

14. The method of claim 10 wherein the cavity is centered on a center of gravity of the optical lens stack.

15. The method of claim 10 wherein the filler material is a thermal insulator.

16. The method of claim 11 wherein the plurality of circular lenses are separated from each other by spacers.

17. A vibration isolator for a cylindrical optical lens stack comprising:
    an inner ring of a mounting structure for the optical lens stack wherein an outside diameter of the inner ring is grooved over a fixed axial distance to form a circumferential channel on the outside diameter of the inner ring;
    an outer ring formed to fit over the inner ring wherein an inside diameter of the outer ring is grooved along the fixed axial distance thereby forming a circumferential cavity between the inside diameter of the outer ring and outside diameter of the inner ring; and
    an energy absorbing conformal filler material that fills the cavity to form a mechanical vibration isolator for the optical lens stack.

18. The vibration isolator of claim 17 wherein the inner ring and the outer ring are metal.

19. The vibration isolator of claim 17 wherein the cavity has axial and circumferential grooves that act to prevent the filler material from rotating or translating during operation.

20. The vibration isolator of claim 17 wherein the filler material is a thermal insulator.

* * * * *